US010446257B2

(12) United States Patent
Kim

(10) Patent No.: US 10,446,257 B2
(45) Date of Patent: Oct. 15, 2019

(54) STORAGE DEVICE AND METHOD OF OPERATING THE SAME

(71) Applicant: SK hynix Inc., Gyeonggi-do (KR)

(72) Inventor: Min Kee Kim, Sejong-si (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/907,518

(22) Filed: Feb. 28, 2018

(65) Prior Publication Data

US 2019/0051372 A1 Feb. 14, 2019

(30) Foreign Application Priority Data

Aug. 11, 2017 (KR) .......................... 10-2017-0102471

(51) Int. Cl.
| | | |
|---|---|---|
| *G11C 16/06* | (2006.01) | |
| *G11C 29/00* | (2006.01) | |
| *G11C 29/52* | (2006.01) | |
| G11C 29/04 | (2006.01) | |
| G11C 16/04 | (2006.01) | |
| G11C 16/08 | (2006.01) | |
| G11C 16/14 | (2006.01) | |
| G11C 16/26 | (2006.01) | |
| G11C 16/10 | (2006.01) | |

(52) U.S. Cl.
CPC ............ *G11C 29/78* (2013.01); *G11C 29/52* (2013.01); *G11C 29/765* (2013.01); *G11C 16/0483* (2013.01); *G11C 16/08* (2013.01); *G11C 16/10* (2013.01); *G11C 16/14* (2013.01); *G11C 16/26* (2013.01); *G11C 29/04* (2013.01); *G11C 2029/0409* (2013.01)

(58) Field of Classification Search
CPC ..... G11C 13/0004; G11C 29/76; G11C 16/10; G11C 16/349; G11C 29/52; G11C 29/808; G11C 29/44; G11C 16/0483; G11C 29/028; G11C 14/0018; G11C 16/16; G11C 16/26; G11C 29/4401

USPC ............ 365/185.05, 185.11, 185.18, 185.09, 365/185.33, 189.05, 200, 230.03, 63

See application file for complete search history.

(56) References Cited

U.S. PATENT DOCUMENTS 10,073,622 B2 *  9/2018  Kim ....................... G11C 29/52
2016/0224267 A1 *  8/2016  Yang ..................... G06F 3/0631

FOREIGN PATENT DOCUMENTS

| KR | 1020120134919 | 12/2012 |
| KR | 1020140142035 | 12/2014 |

* cited by examiner

*Primary Examiner* — Thong Q Le
(74) *Attorney, Agent, or Firm* — IP & T Group LLP

(57) ABSTRACT

Provided herein may be a storage device having improved operating speed and a method of operating the same. The storage device may include a memory controller configured to control the plurality of dies, each including two or more planes. The memory controller may include a reserved block information storage unit configured to store reserved block information that is information related to reserved blocks included in the plurality of dies; and a bad block management control unit configured to set, when a bad block occurs among memory blocks respectively included in the plurality of dies, a reserved block to replace the bad block depending on whether any one of available reserved blocks are included in a plane to which the bad block belongs, among the two or more planes included in a die including the bad block, based on the reserved block information.

10 Claims, 14 Drawing Sheets

212

| DIE | PLANE | RESERVED BLK |
|---|---|---|
| 0 | 0 | 0 |
|   | 1 | 1 |
|   | 2 | 0 |
|   | 3 | 0 |
| 1 | 0 | 0 |
|   | 1 | 0 |
|   | 2 | 0 |
|   | 3 | 0 |
| ⋮ | ⋮ | ⋮ |

STORAGE DEVICE AND METHOD OF OPERATING THE SAME

CROSS-REFERENCE TO RELATED APPLICATION

The present application claims priority under 35 U.S.C. § 119(a) to Korean patent application number 10-2017-0102471 filed on Aug. 11, 2017, which is incorporated herein by reference in its entirety.

BACKGROUND

1. Field of Invention

Various embodiments of the present disclosure generally relate to an electronic device. Particularly, the exemplary embodiments relate to a storage device and a method of operating the storage device.

2. DESCRIPTION OF THE RELATED ART

A storage device is a device for storing data under the control of a host device, such as a computer, a smart phone, or a smart pad. Examples of the storage device include a device for storing data in a magnetic disk, as in the case of a hard disk drive (HDD), and a device for storing data in a semiconductor memory, especially in a nonvolatile memory, as in the case of a solid state drive (SSD) or a memory card.

Examples of the nonvolatile memory include a read-only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

SUMMARY

Various embodiments of the present disclosure are directed to a storage device having improved operating speed, and a method of operating the storage device.

An embodiment of the present disclosure may provide for a memory controller for controlling a plurality of dies, each including two or more planes. The memory controller may include a reserved block information storage unit configured to store reserved block information that is information related to reserved blocks included in the plurality of dies; and a bad block management control unit configured to set, when a bad block occurs among memory blocks respectively included in the plurality of dies, a reserved block to replace the bad block depending on whether any one of available reserved blocks are included in a plane to which the bad block belongs, among the two or more planes included in a die including the bad block, based on the reserved block information.

An embodiment of the present disclosure may provide for a method of operating a memory controller for controlling a plurality of dies, each including two or more planes. The method may include detecting a bad block that has occurred, among memory blocks respectively included in the plurality of dies; and setting a reserved block to replace the bad block depending on whether any available reserved blocks are included in a plane to which the bad block belongs, among two or more planes included in a die including the bad block.

An embodiment of the present disclosure may provide for a storage device. The storage device may include a plurality of dies each including two or more planes and a memory controller configured to control the plurality of dies, wherein the memory controller comprises: a bad block management unit configured to set, when a bad block occurs, among memory blocks respectively included in the plurality of dies, a reserved block to replace the bad block depending on whether any available reserved blocks are included in a plane to which the bad block belongs, among the two or more planes included in a die including the bad block, and replace the bad block with the set reserved block.

An embodiment of the present disclosure may provide for a memory system. The memory system may include first and second dies suitable for accessing data therein in an interleaved manner and a controller suitable for replacing, when no reserved block is available in the first die, a bad block of the first die with a reserved block of the second die, and controlling the second die to program a first data, which is supposed to be programmed into the bad block, into the replaced block while controlling the first die to program a second data into a normal block of the first die.

DETAILED DESCRIPTION

Figure 1:
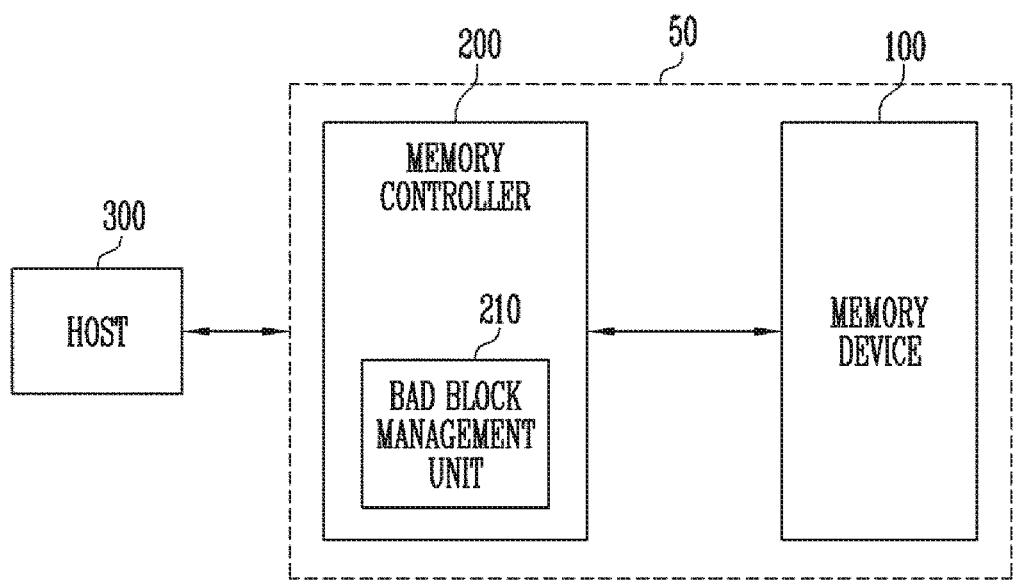
FIG. 1 is a diagram illustrating a storage device according to an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will not be described in detail based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first" and/or "second" may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Embodiments of the present disclosure are described with reference to the accompanying drawings in order to describe the present disclosure in detail so that those having ordinary knowledge in the technical field to which the present disclosure pertains can easily practice the present disclosure.

FIG. 1 is a diagram illustrating a storage device according to an embodiment of the present disclosure.

Referring to FIG. 1, a storage device 50 may include a memory device 100 and a memory controller 200.

The memory device 100 may store data. The memory device 100 is operated under the control of the memory controller 200. The memory device 100 may include a memory cell array including a plurality of memory cells in which data is stored. The memory cell array may include a plurality of memory blocks. Each memory block may include a plurality of memory cells. The memory device 100 may store data in the memory blocks either sequentially or randomly under the control of the memory controller 200. In an embodiment, examples of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In an embodiment, the memory device 100 may be implemented as a three-dimensional (3D) array structure. The present disclosure may also be applied not only to a flash memory in which a charge storage layer is implemented as a conductive floating gate (FG), but also to a charge trap flash (CTF) memory in which a charge storage layer is implemented as an insulating layer.

The memory device 100 may receive a command and an address from the memory controller 200, and access a region, selected in response to the address, in the memory cell array. That is, the memory device 100 may perform an operation corresponding to the command on the region selected in response to the address. For example, the memory device 100 may perform a write operation (i.e., a program operation), a read operation, and an erase operation. During a program operation, the memory device 100 may program data in the region selected in response to the address. During a read operation, the memory device 100 may read data from the region selected in response to the address. During an erase operation, the memory device 100 may erase data stored in the region selected in response to the address.

The memory controller 200 may control the operation of the memory device 100 in response to a request from a host 300, or may control the operation of the memory device 100 regardless of the request from the host 300.

For example, the memory controller 200 may control the memory device 100 so that a program operation, a read operation, or an erase operation is performed in response to the request from the host 300. During a program operation, the memory controller 200 may provide a program command, a physical address, and data to the memory device 100. During a read operation, the memory controller 200 may provide a read command and a physical address to the memory device 100. During an erase operation, the memory controller 200 may provide an erase command and a physical address to the memory device 100.

In an embodiment, the memory controller 200 may autonomously generate a program command, an address, and data without receiving a request from the host 300, and transmit them to the memory device 100. For example, the memory controller 200 may provide commands, addresses, and data to the memory device 100 to perform background operations, such as a program operation for wear leveling and a program operation for garbage collection.

The memory controller 200 may run firmware (FW) for controlling the memory device 100. When the memory device 100 is a flash memory device, the memory controller 200 may operate firmware such as a Flash Translation Layer (FTL) for controlling communication between the host 300 and the memory device 100.

In detail, the memory controller 200 may translate a logical address included in a request from the host 300 into a physical address.

When a bad block occurs among the plurality of memory blocks included in the memory device 100, the bad block should be detected and replaced with a normal block so as to guarantee reliability of the memory device. Such a bad block may be a block in or from which data cannot be normally stored or read. In an embodiment, a bad block may be initially included in the memory device 100 at the time at which the memory device 100 is shipped or may occur due to subsequent factors. For example, a bad block may occur due to various causes. In an embodiment, a bad block may occur due to a column failure, disturbance, wear-out, etc. Further, when a bad block occurs, the memory device 100 fails in executing a command provided by the memory controller 200, for example, a read command or a program command, and is capable of transmitting a signal, indicating that the execution of the command has failed, to the memory controller 200. The memory controller 200 may identify a memory block having failed in executing a command as a bad block.

Since data cannot be stored in the bad block, the bad block should be replaced with a normal block. Therefore, when a bad block occurs in the memory device 100, the memory controller 200 may control the memory device 100 so that the memory device 100 provides a substitute block (i.e., a reserved block) that is normal, which will replace the bad block.

In accordance with an embodiment of the present disclosure, the memory controller 200 may further include a bad block management unit 210.

The bad block management unit 210 may replace a bad block with a reserved block that is a normal block by mapping the address of the bad block to the address of the reserved block. The bad block management unit 210 may renew and update an address mapping table indicating a mapping relationship between logical addresses and physical addresses. By means of this renewal and update, the bad block management unit 210 may translate the logical address of the bad block into the physical address of the reserved block so that the logical address of the bad block corresponds to the physical address of the reserved block, and may store the updated address mapping table in RAM included in the memory controller 200 or the memory device 100. Therefore, when a data access request (e.g., a read request) for the bad block is received from the host 300, the memory controller 200 may provide the physical address of the reserved block to the memory device 100 with reference to the updated address mapping table.

In an embodiment of the present disclosure, the memory controller 200 may control a plurality of memory devices. In this case, the bad block management unit 210 may replace the bad block with a normal block included in a different memory device. For this, the bad block management unit 210 of the memory controller 200 may include reserved block information (not illustrated) indicating information about reserved blocks included in the plurality of memory devices.

A method in which the bad block management unit 210 replaces a bad block with a normal block will be described in detail later with reference to FIGS. 7 to 12.

In various embodiments, the memory controller 200 may control the plurality of memory devices in an interleaved manner. For example, the memory controller 200 may control the plurality of memory devices so that a data input/output operation is possible in an interleaved manner while sharing a single channel. The plurality of memory devices may respectively correspond to a plurality of ways coupled to a single channel.

The host 300 may communicate with the storage device 50 using at least one of various communication methods such as Universal Serial Bus (USB), Serial AT Attachment (SATA), High Speed Interchip (HSIC), Small Computer System Interface (SCSI), Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM).

Figure 2:
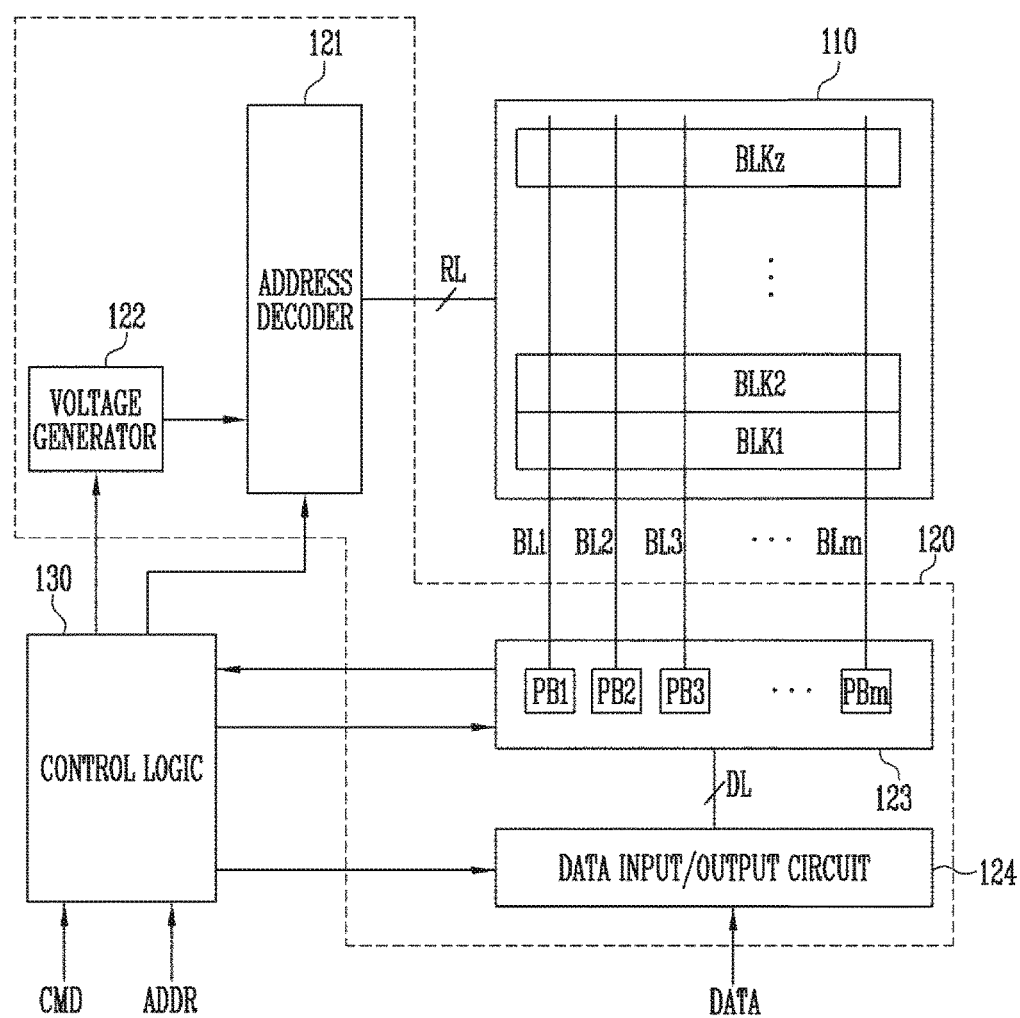
FIG. 2 is a diagram illustrating a structure of a memory device of FIG. 1.

FIG. 2 is a diagram illustrating a structure of the memory device 100 of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 110 is composed of a plurality of pages. In an embodiment, each of the plurality of memory blocks BLK1 to BLKz included in the memory cell array 110 may include a plurality of dummy cells. One or more of the dummy cells may be coupled in series between a drain select transistor and the memory cells, and between a source select transistor and the memory cells.

The memory cells of the memory device 100 may each be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include an address decoder 121, a voltage generator 122, the read and write circuit 123, and a data input/output circuit 124.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate under the control of the control logic 130. The address decoder 121 receives the address ADDR from the control logic 130.

The address decoder 121 may decode a block address of the received address ADDR. The address decoder 121 selects at least one memory block from among the memory blocks BLK1 to BLKz in response to the decoded block address. The address decoder 121 may decode a row address of the received address ADDR. The address decoder 121 may select at least one word line of the selected memory block by applying voltages supplied from the voltage generator 122 to at least one word line WL in response to the decoded row address.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verification pass voltage higher than the verify voltage to unselected word lines.

During a read operation, the address decoder 121 may apply a read voltage to a selected word line and apply a pass voltage higher than the read voltage to unselected word lines.

In an embodiment, the erase operation of the memory device 100 may be performed on a memory block basis. During an erase operation, the address ADDR input to the memory device 100 includes a block address. The address decoder 121 may decode the block address and select a single memory block in response to the decoded block address. During the erase operation, the address decoder 121 may apply a ground voltage to word lines coupled to the selected memory block.

In an embodiment, the address decoder 121 may decode a column address of the received address ADDR. A decoded column address DCA may be transferred to the read and write circuit 123. In an exemplary embodiment, the address decoder 121 may include components such as a row decoder, a column decoder, and an address buffer.

The voltage generator 122 may generate a plurality of voltages using an external supply voltage provided to the memory device 100. The voltage generator 122 is operated under the control of the control logic 130.

In an embodiment, the voltage generator 122 may generate an internal supply voltage by regulating the external supply voltage. The internal supply voltage generated by the voltage generator 122 is used as an operating voltage of the memory device 100.

In an embodiment, the voltage generator 122 may generate a plurality of voltages using an external supply voltage or an internal supply voltage. The voltage generator 122 may generate various voltages required by the memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal supply voltage and may generate a plurality of voltages by selectively activating the pumping capacitors under the control of the control logic 130.

The generated voltages may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data to be stored DATA through the data input/output circuit 124 and data lines DL.

During a program operation, the first to m-th page buffers PB1 to PBm may transfer the data DATA, received through the data input/output circuit 124, to selected memory cells through the bit lines BL1 to BLm when a program pulse is applied to each selected word line. The memory cells in the selected page are programmed based on the transferred data DATA. Memory cells coupled to a bit line to which a program permission voltage (e.g. a ground voltage) is applied may have increased threshold voltages. Threshold voltages of memory cells coupled to a bit line to which a program prohibition voltage (e.g. a supply voltage) is applied may be maintained. During a program verify operation, the first to m-th page buffers read page data from the selected memory cells through the bit lines BL1 to BLm.

During a read operation, the read and write circuit 123 reads data DATA from the memory cells in the selected page through the bit lines BL, and outputs the read data DATA to the data input/output circuit 124.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 may be operated under the control of the control logic 130.

The data input/output circuit 124 may include a plurality of input/output buffers (not illustrated) for receiving input data. During a program operation, the data input/output circuit 124 may receive data to be stored DATA from an external controller (not shown). During a read operation, the data input/output circuit 124 may output the data, received from the first to m-th page buffers PB1 to PBm included in the read and write circuit 123, to the external controller.

The control logic 130 may be coupled to the address decoder 121, the voltage generator 122, the read and write circuit 123, and the data input/output circuit 124. The control logic 130 may control the overall operation of the memory device 100. The control logic 130 may be operated in response to a command CMD received from an external device.

Figure 3:
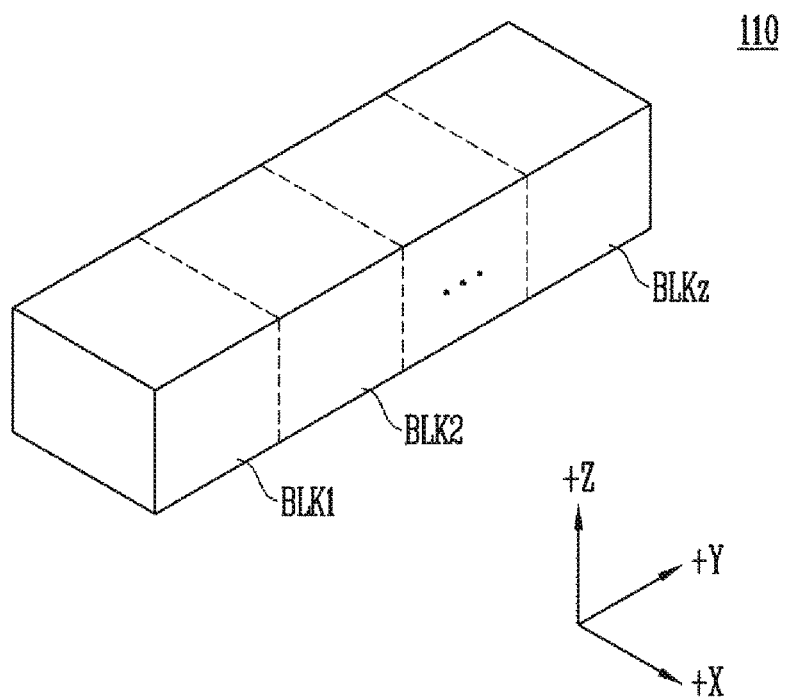
FIG. 3 is a diagram illustrating an embodiment of a memory cell array of FIG. 2.

FIG. 3 is a diagram illustrating an embodiment of the memory cell array 110 of FIG. 2.

Referring to FIG. 3, the memory cell array 110 may include the plurality of memory blocks BLK1 to BLKz. Each of the memory blocks may have a two-dimensional (2D) or a three-dimensional (3D) structure. Each of the memory blocks may include the plurality of memory cells stacked on a substrate. When the memory blocks have a 3D structure, as shown in FIG. 3, the memory cell array 110 may include a plurality of memory blocks BLK1 to BLKz each having a 3D structure (or vertical structure). The plurality of memory cells is arranged in a +X-axis direction, a +Y-axis direction, and a +Z-axis direction. A structure of each of the memory blocks will be described in more detail with reference to FIGS. 4 and 5.

Figure 4:
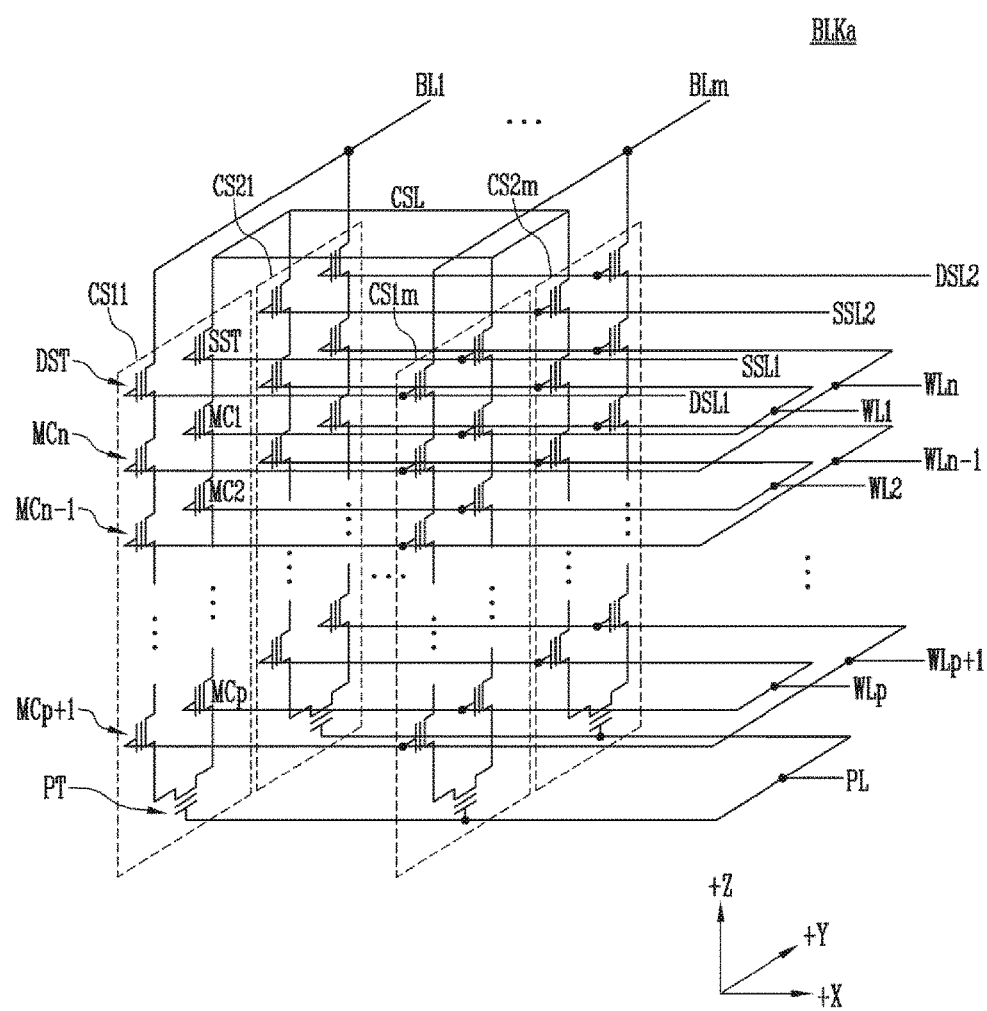
FIG. 4 is a circuit diagram illustrating any one memory block BLKa among a plurality of memory blocks BLK1 to BLKz of FIG. 3.

FIG. 4 is a circuit diagram illustrating any one memory block BLKa among the plurality of memory blocks BLK1 to BLKz of FIG. 3.

Referring to FIG. 4, the memory block BLKa includes a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings are arranged in a row direction (i.e. a positive (+) X direction). In FIG. 4, two cell strings are shown as being arranged in a column direction (i.e. a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 4, source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to nth memory cells MCp+1 to MCn are coupled to each other through the pipe transistor PT. The gates of the first to n-th memory cells MC1 to MCn of each cell string are coupled to first to n-th word lines WL1 to WLn, respectively.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extended in a column direction. In FIG. 4, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1m or CS21 to CS2m arranged in a row direction, may be coupled to the even bit lines, respectively, and odd-numbered cell strings, among the cell strings CS11 to CS1m or CS21 to CS2m arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 5:
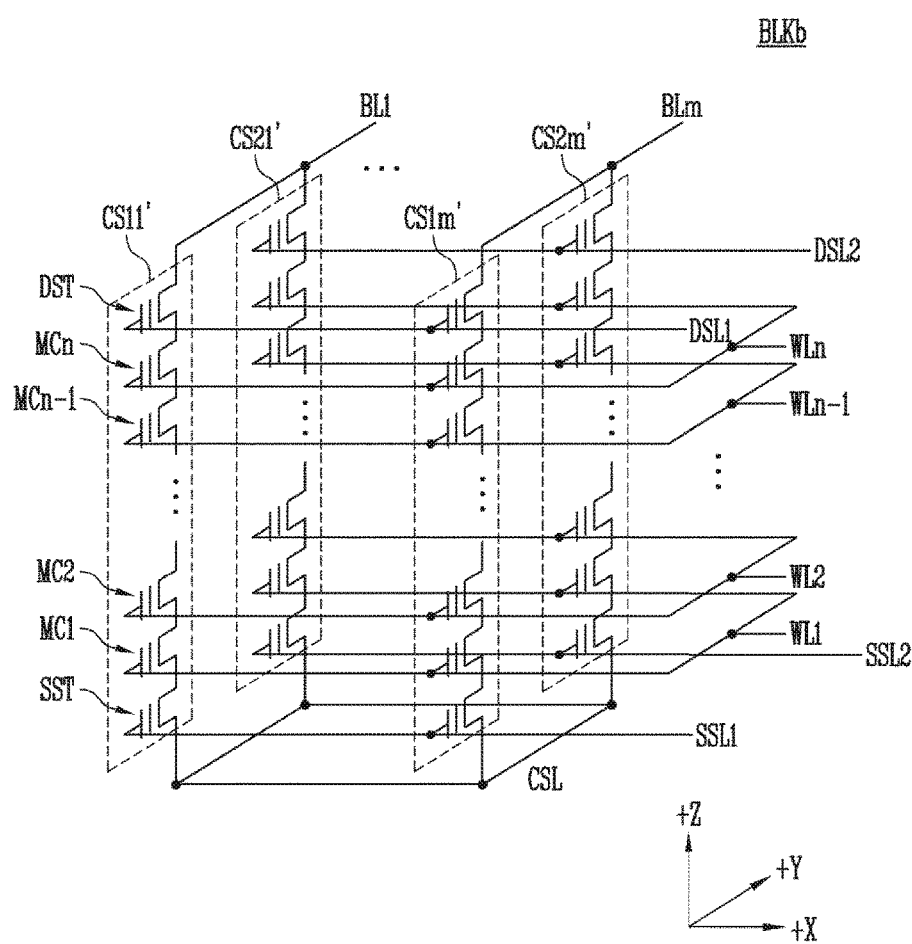
FIG. 5 is a circuit diagram illustrating an example of any one memory block BLKb of the memory blocks BLK1 to BLKz of FIG. 3.

FIG. 5 is a circuit diagram illustrating an example of any one memory block BLKb among the plurality of memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' is extended along a positive (+) Z direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to nth memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 5 has a circuit substantially similar to that of the memory block BLKa of FIG. 4, with the exception of a pipe transistor PT being excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 6:
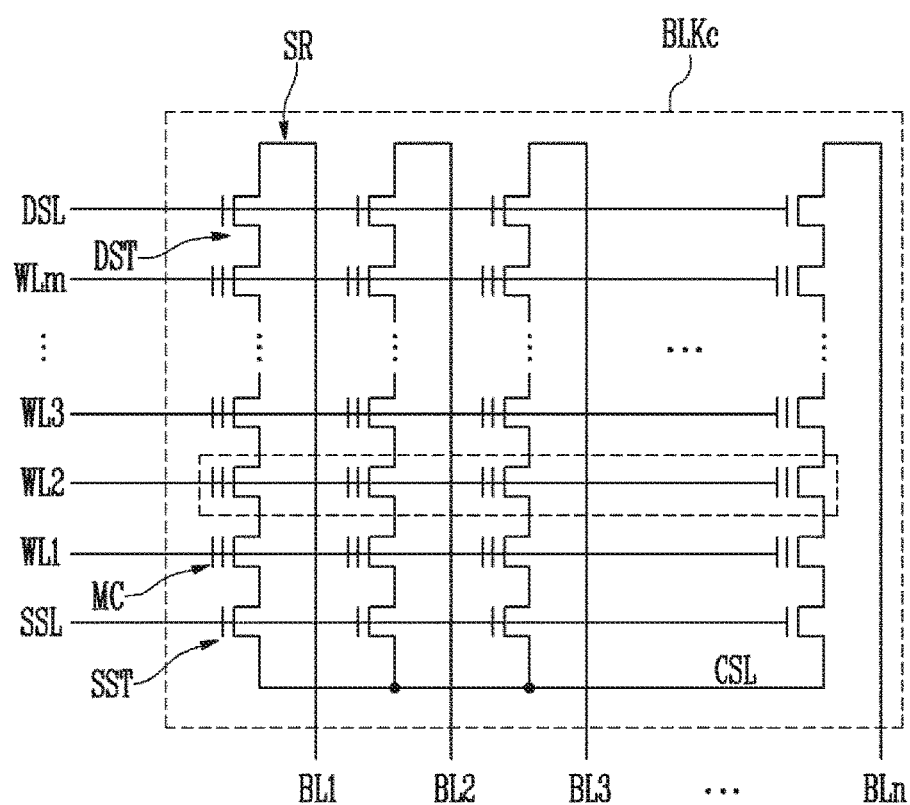
FIG. 6 is a circuit diagram illustrating an example of any one memory block BLKc among the plurality of memory blocks BLK1 to BLKz of FIG. 3.

FIG. 6 is a circuit diagram illustrating an example of any one memory block BLKc among the plurality of memory blocks BLK1 to BLKz of FIG. 3.

Referring to FIG. 6, the memory block BLKc may include a plurality of strings SR. The plurality of strings SR may be respectively coupled to a plurality of bit lines BL1 to BLn. Each string SR may include a source select transistor SST, memory cells MC, and a drain select transistor DST.

The source select transistor SST in each string SR may be coupled between the memory cells MC and a common source line CSL. The source select transistors SST of the plurality of strings SR may be coupled in common to the common source line CSL.

The drain select transistor DST in each string SR may be coupled between the memory cells MC and the corresponding bit line BL. The drain select transistors DST of the plurality of strings SR may be respectively coupled to the bit lines BL1 to BLn.

In each string SR, a plurality of memory cells MC may be provided between the source select transistor SST and the drain select transistor DST. In each string SR, the memory cells MC may be coupled in series to each other.

In the strings SR, memory cells MC disposed at the same sequential positions from the common source line CSL may be coupled in common to a single word line. The memory cells MC of the plurality of strings SR may be coupled to a plurality of word lines WL1 to WLm.

In the memory block BLKc, an erase operation may be performed on a memory block basis. When the erase operation is performed on a memory block basis, all memory cells MC in the memory block BLKc may be simultaneously erased in response to a single erase request.

Figure 7:
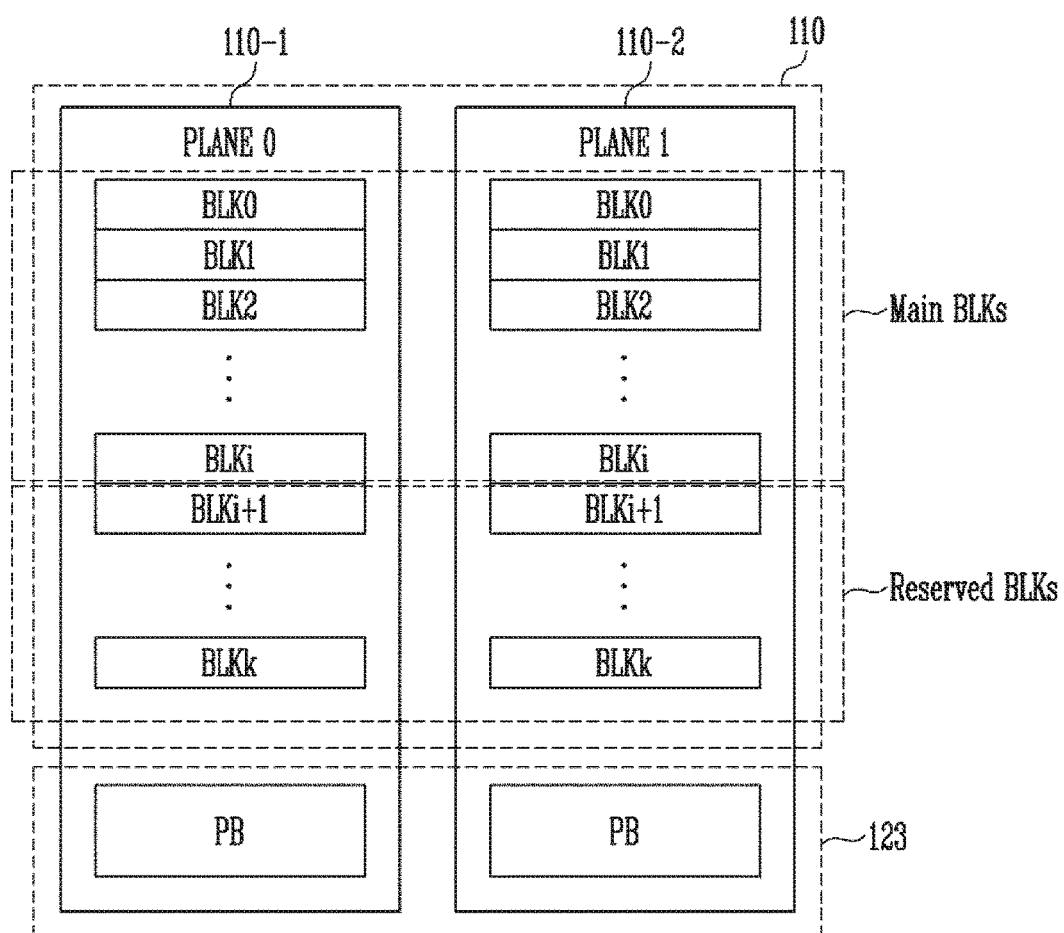
FIG. 7 is a block diagram illustrating the memory cell array illustrated in FIG. 2 in a multi-plane structure according to an embodiment.

FIG. 7 is a block diagram illustrating the memory cell array 110 of FIG. 2 in a multi-plane structure according to an embodiment.

Referring to FIG. 7, the memory cell array 110 may be composed of a plurality of planes. Although FIG. 7 illustrates a case in which a single memory device is composed of two planes PLANE0 and to PLANE1, the present disclosure is not limited thereto. That is, in other embodiments, the number of planes included in the memory device may be three or more. For example, the memory device may include four planes or eight planes. However, for convenience of description and illustrative purposes, an example case in which a memory device having two planes will be described with reference to FIG. 7.

A single plane may include a plurality of memory blocks BLK0 to BLKk. Further, since each of the plurality of planes includes an independent page buffer PB, a program operation, a read operation, or an erase operation may be simultaneously performed on the plurality of planes. This operation is referred to as a "multi-plane operation".

Each of the plurality of planes may include main blocks BLK0 to BLKi and reserved blocks BLKi+1 to BLKk.

The main blocks BLK0 to BLKi may be regions in which data is stored, and the reserved blocks BLKi+1 to BLKk may be normal blocks for replacing bad blocks among the main blocks BLK0 to BLKi.

According to a prior art, when a bad block occurs in a plane of a die, the memory controller 200 replaces the bad block with any one of reserved blocks of that plane of the die. The reason for this is that, when the bad block is replaced with a reserved block included in the same plane in the die, a multi-plane operation, that is, a simultaneous operation of a plurality of planes, is possible. For example, when a bad block occurs in main blocks of plane 0, the bad block may be replaced with a reserved block of the plane 0, whereas when a bad block occurs in main blocks of plane 1, the bad block may be replaced with a reserved block of the plane 1.

However, when all reserved blocks included in a plane to which the bad block belongs are occupied, the bad block may be replaced with a reserved block of a plane different from the plane in which the bad block is included. In this case, in the corresponding die, a multi-plane operation cannot be performed. The reason for this is that the same operation is repeatedly performed on the same plane. For example, assuming that a bad block occurs in the main blocks of plane 0 and all reserved blocks in plane 0 are occupied, the bad block may be replaced with a reserved block in plane 1.

A parallel processing of a program operation having a relatively long operating time through an interleaving operation or a multi-plane operation may be more helpful in improving performance in a flash memory. For example, when a bad block of a first plane is replaced with a reserved block in a second plane, a multi-plane operation cannot be performed between the first and second planes since the program operation on the same second plane should be repeatedly performed in response to program commands for both of the first and second planes. Here, overhead may occur.

Figure 8:
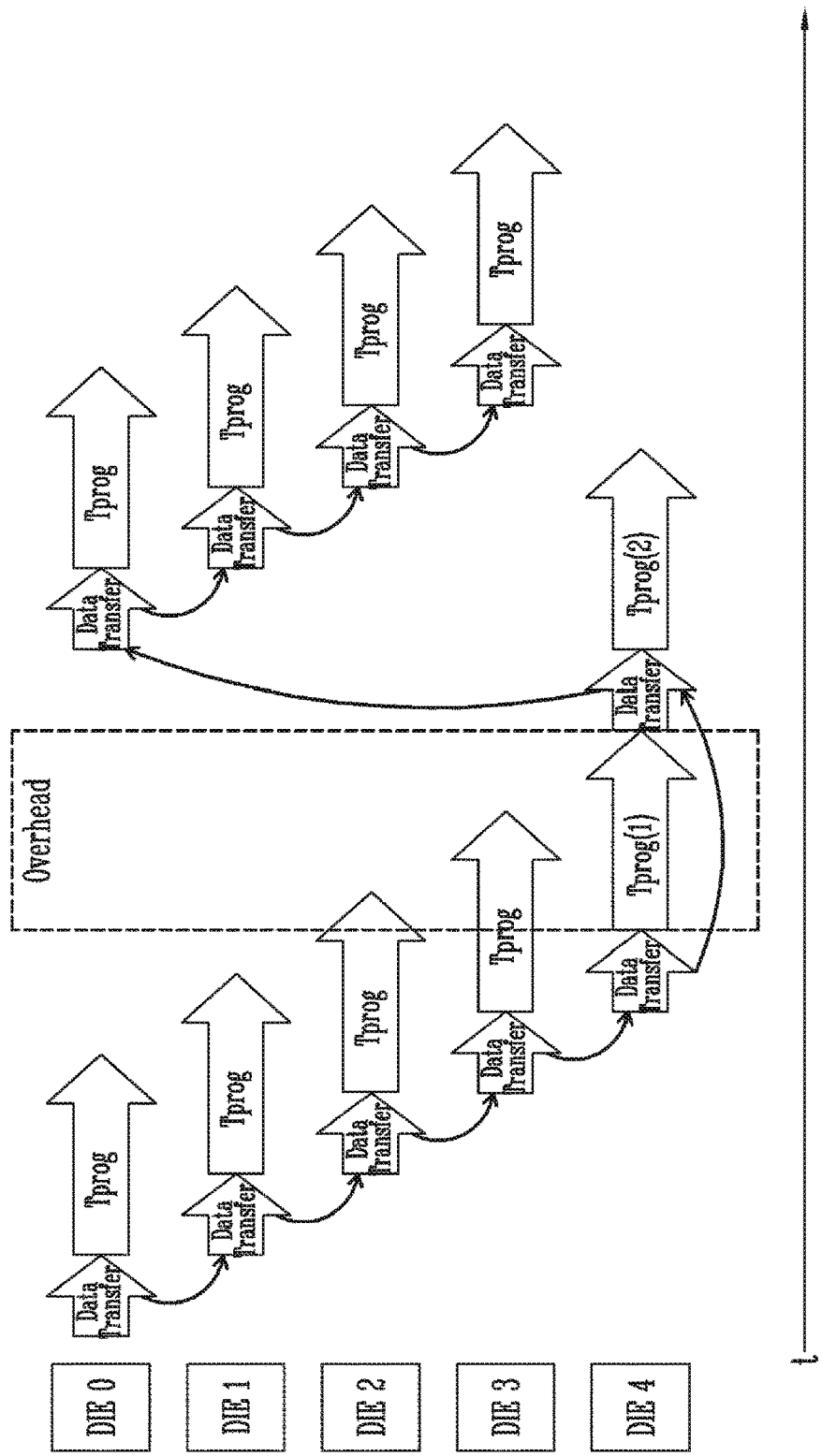
FIG. 8 is a diagram describing an operation performed when a bad block is replaced with a reserved block in a plane different from a plane to which the bad block belongs.

FIG. 8 is a diagram describing an operation performed when a bad block is replaced with a reserved block in a plane different from a plane to which the bad block belongs.

In FIG. 8, a description will be made on the assumption that the memory controller 200 controls five memory dies (die 0 to die 4). A single memory die corresponds to a single memory device described above with reference to FIG. 2. In FIG. 8, a case where the memory controller 200 performs a program operation on memory devices corresponding to die 0 to die 4 in an interleaved manner is described.

When die 0 to die 4 are assumed to be coupled to the same channel, a data input operation (i.e., a data transfer operation) cannot be simultaneously performed. In order to compensate for such an operation, the memory controller 200 may sequentially input (transfer) data to die 0 to die 4, and individual memory dies die 0 to die 4 may perform a program operation with the inputted data. In FIG. 8, "Tprog" denotes a time during which each die performs a program operation with the inputted data.

FIG. 8 illustrates an operation performed when a bad block in a plane of die 4 is replaced with a reserved block in a different plane of die 4.

Referring to FIGS. 7 and 8, a multi-plane operation may be performed on die 0 to die 3. That is, when a data transfer operation is performed on die 0 to die 3, corresponding data may be transferred to plane 0 and plane 1 included in each of die 0 to die 3 may be inputted (i.e., transferred), and pieces of data may be simultaneously stored in memory blocks included in the two planes during the time "Tprog".

However, in case of die 4, the bad block is replaced with a reserved block belonging to another plane, and thus a program operation is repeatedly performed on the same plane. For example, assuming that a bad block occurs in plane 1 of die 4 and is replaced with a reserved block in plane 0 of die 4, a program operation on plane 0 may be performed twice. Therefore, in order to perform a program operation on the main block of plane 0 in die 4, a data transfer operation is performed on plane 0 and a program operation is then performed, as shown with denotation "Tprog (1)" in FIG. 8. Thereafter, in order to perform a program operation on the reserved block in plane 0, a data transfer operation is performed and a program operation is performed on the reserved block in plane 0, as shown with denotation "Tprog(2)" in FIG. 8. Therefore, since program operations through the multi-plane operation cannot be performed in parallel, overhead of a performance time of "Tprog(1)" may occur.

Figure 9:
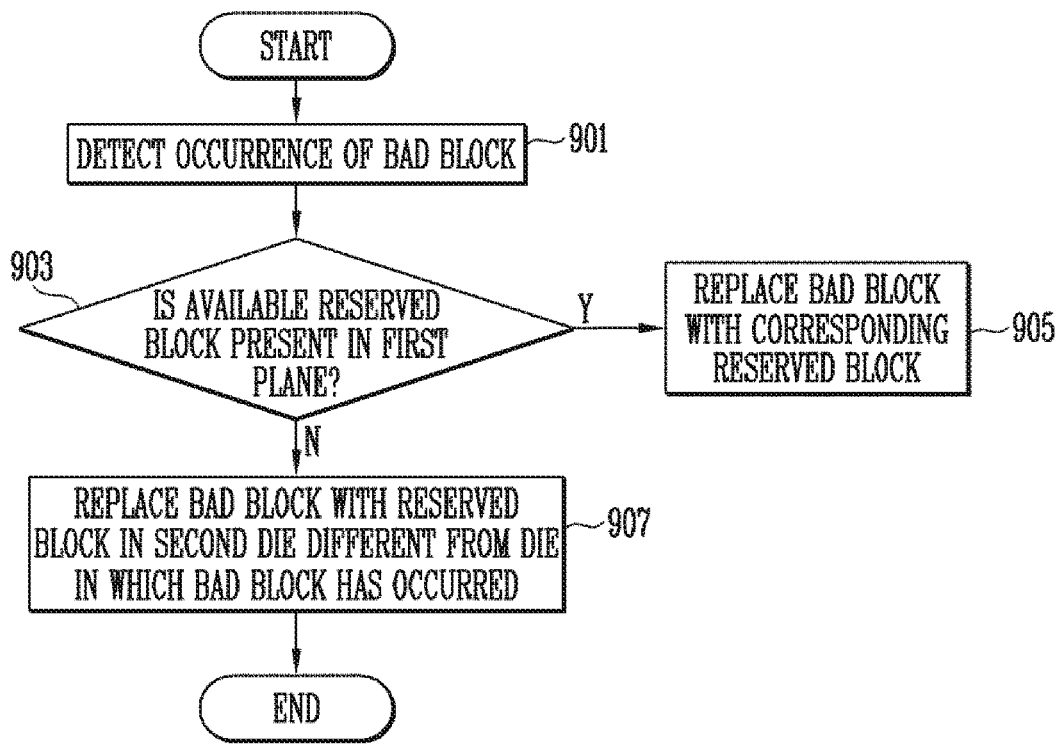
FIG. 9 is a flowchart illustrating the operation of a memory controller according to an embodiment of the present disclosure.

FIG. 9 is a flowchart illustrating the operation of the memory controller 200 according to an embodiment of the present disclosure.

Referring to FIG. 9, at step 901, the memory controller 200 may detect a bad block in a first plane of a first die.

At step 903, the memory controller 200 may determine whether an available reserved block is present in the first plane. If it is determined that the available reserved block is present in the first plane (that is, 'Y' at step 903), the process proceeds to step 905. At step 905, the memory controller 200 replaces the bad block with the reserved block of the first plane.

However, if it is determined that an available reserved block is not present in the first plane (that is, 'N' at step 903), the process proceeds to step 907. At step 907, the memory controller 200 may replace the bad block with a reserved block included in a second die different from the first die.

Figure 10:
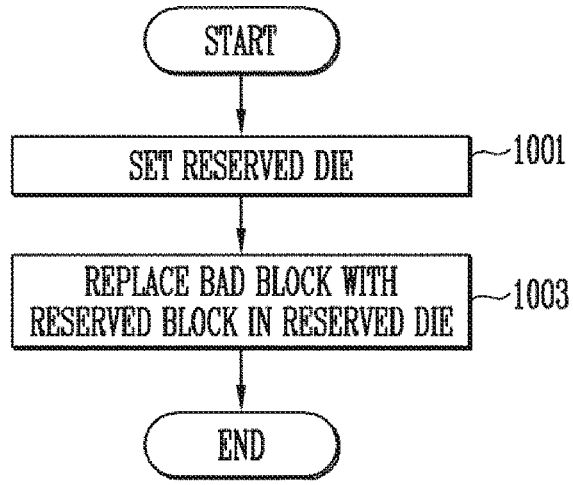
FIG. 10 is a flowchart illustrating a method of replacing a bad block with a reserved block in a die different from a die to which the bad block belongs, illustrated in FIG. 9.

FIG. 10 is a flowchart illustrating step 907 of replacing a bad block with a reserved block in the second die different from the first die as illustrated in FIG. 9.

Referring to FIG. 10, the memory controller 200 may set a reserved die at step 1001. For example, the memory controller 200 may set the second die as a reserved die.

In an embodiment, when all dies are operated in an interleaved manner, the reserved die may be set to a die having greatest difference in operation timing among all of dies with reference to a die including the bad block. For example, when a total of 10 dies ranging from die 1 to die 10 are operated in an interleaved manner, and a bad block occurs in die 8, among the 10 dies, a reserved die may be die 3.

At step 1003, the memory controller 200 may replace the bad block of the first die (i.e., die 8 in the previous example) with any one of reserved blocks included in the second die or the reserved die (i.e., die 3 in the previous example).

Figures 11, 12:
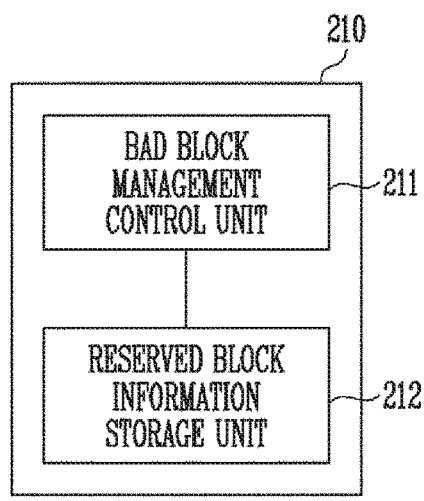
FIG. 11 is a diagram describing the structure of a bad block management unit of FIG. 1.
FIG. 12 is a diagram describing reserved block information of FIG. 11.

FIG. 11 is a diagram describing a structure of the bad block management unit 210 of FIG. 1.

Referring to FIG. 11, the bad block management unit 210 may include a bad block management control unit 211 and a reserved block information storage unit 212.

The bad block management control unit 211 may detect a bad block. A bad block may be initially included in a memory device at the time at which the memory device is fabricated or may occur due to subsequent factors. For example, a bad block may occur due to various causes. In an embodiment, a bad block may occur due to a column failure, disturbance, wear-out, etc. Further, when a bad block occurs, the memory device fails in executing a command provided by a memory controller, for example, a read command or a program command, and may transmit a signal, indicating that the execution of the command has failed, to the memory controller. The bad block management control unit 211 may detect a bad block using the signal indicating that the execution of the command has failed.

In an embodiment, the bad block management control unit 211 may replace a bad block with a reserved block by mapping the address of the bad block to the address of the reserved block. In order to replace the bad block with the reserved block, an operation of moving all or part of data included in the bad block to the reserved block may be performed. In an embodiment, the bad block management control unit 211 may renew and update an address mapping table indicating a mapping relationship between logical addresses and physical addresses. By means of this renewal and update, the bad block management control unit 211 may translate the logical address of the bad block into the physical address of the reserved block so that the logical address of the bad block corresponds to the physical address of the reserved block, and may store the updated address mapping table in RAM included in the memory controller or the memory device 100.

The bad block management control unit 211 may set a reserved block based on reserved block information stored in the reserved block information storage unit 212. The bad block management control unit 211 may determine whether reserved blocks included in the same plane as the bad block are available. If it is determined that reserved blocks included in the same plane as the bad block are available, the bad block management control unit 211 may replace the bad block with the available reserved block of the same plane.

In an embodiment, if all reserved blocks included in the same plane as the bad block are occupied and there is no available reserved block, the bad block management control unit 211 may replace the bad block with any one of reserved blocks in a different die from a die including the bad block.

In an embodiment, when replacing the bad block with any one of reserved blocks in the different die, the bad block management control unit 211 may select a reserved block that may minimize any influence to the interleaving operation. For example, the bad block management control unit 211 may set a reserved die including a reserved block for replacing the bad block. The bad block management control unit 211 may replace the bad block with any one of reserved blocks included in the reserved die. In an embodiment, the bad block management control unit 211 may set the reserved die based on the following Equation (1):

$$ReservedDie = mod((CurrentDie + TotalDies/2), TotalDies) \quad (1)$$

Referring to Equation (1), "CurrentDie" denotes index representing a die including the bad block, and "TotalDies" denotes the total number of dies coupled in common to a channel coupled to the die including the bad block. Therefore, the reserve die may be determined as a die corresponding to the remainder obtained by dividing the sum of current die number and the ½ value of the total die number divided by the total die number. According to Equation (1), if all dies are operated in an interleaved manner, the reserved die may be determined as a die having greatest difference in operation timing among all of dies with reference to a die including the bad block. For example, when a total of 10 dies ranging from die 1 to die 10 are operated in an interleaved manner and a bad block occurs in die 8, among the 10 dies, a reserved die may be die 3.

When the reserved die is set based on Equation (1), the bad block management control unit 211 may replace the bad block with any one of reserved blocks included in the reserved die, which is different from the die including the bad block.

Although, in FIG. 11, the bad block management control unit 211 and the reserved block information storage unit 212 have been illustrated as components of the bad block management unit 210, these are merely components for explaining the present disclosure, and the bad block management unit 210 may include more components in various embodiments. For example, the bad block management unit 210 may store information about bad blocks included in memory devices that are controlled by the memory controller. Alternatively, the bad block management unit 210 may generate commands for moving part or all of data in the bad block to the reserved block, and may provide the generated commands to the memory device.

FIG. 12 is a diagram describing reserved block information stored in the reserved block information storage unit 212 of FIG. 11.

Referring to FIG. 12, the reserved block information may include both plane information PLANE representing a plurality of planes included in each of the plurality of dies controlled by the memory controller 200 and status information RESERVED BLK indicating whether available reserved blocks are present in the respective planes. For example, a case where the status information RESERVED BLK is "0" means that an available reserved block is present in a corresponding plane and a case where the status information RESERVED BLK is "1" means that no available reserved block is present in a corresponding plane. However, the reserved block information of FIG. 12 is only an example, and may also include status information about each of reserved blocks indicating whether individual reserved blocks included in each plane are available.

Figure 13:
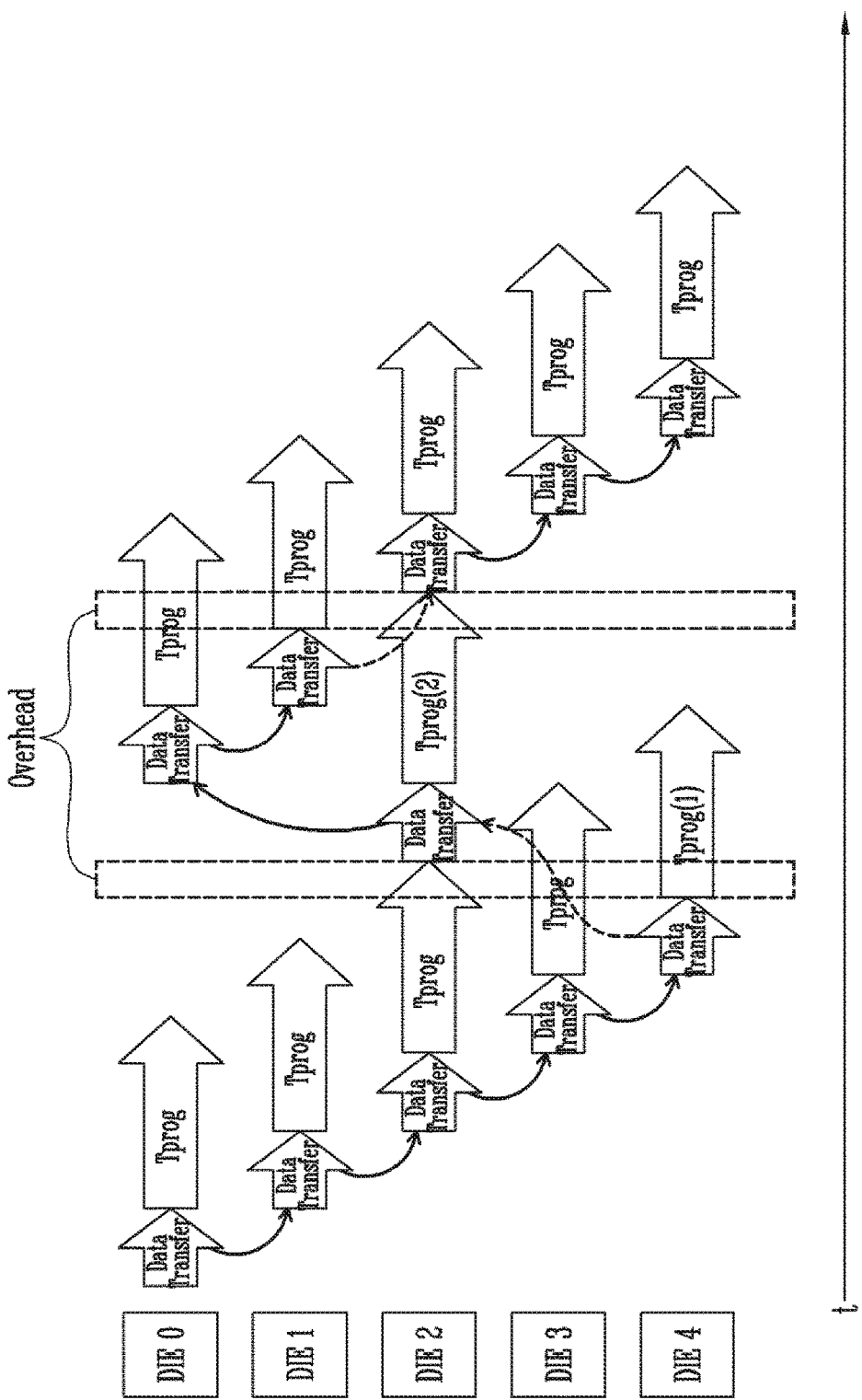
FIG. 13 is a diagram describing an operation performed when a bad block is replaced with a reserved block in a die different from a die to which the bad block belongs according to an embodiment of the present disclosure.

FIG. 13 is a diagram describing an operation performed when a bad block is replaced with a reserved block in a die different from a die to which the bad block belongs according to an embodiment of the present disclosure.

In FIG. 13, it is assumed that a bad block occurs in plane 1 of die 4 and that an available reserved block is not present in plane 1 of die 4.

The memory controller 200 may set a reserved die based on the above-described Equation (1). The set reserved die is die 2, and the bad block in die 4 is replaced with a reserved block belonging to a certain plane of die 2.

Referring to FIG. 13, die 4 receives data from the memory controller 200 so as to perform a program operation on a main block in plane 0. Thereafter, a program operation may be performed on plane 0 of die 4, as illustrated with denotation "Tprog(1)".

However, for data supposed to be programmed into the bad blocks in plane 1 of die 4, which is currently replaced with a reserved block in die 2. Therefore, in order to perform the program operation on the reserved block in die 2, die 2 may receive data from the memory controller 200, and may perform a program operation on the reserved block, as illustrated with denotation "Tprog(2)".

In accordance with an embodiment of FIG. 13, while data is being programmed into a normal block of a first die (e.g., die 4) when a bad block of the first die is replaced with a reserved block in a second die (e.g., die 2) different from the first die, data supposed to be programmed into the bad block may be programmed the reserved block in a pipelining manner although a multi-plane operation may be impossible due to the replacement of the bad block with the reserved block in different dies. As illustrated in FIGS. 8 and 13, the overhead according to the prior art of FIG. 8 may be reduced to the overhead according to an embodiment of the present invention of FIG. 13.

Figure 14:
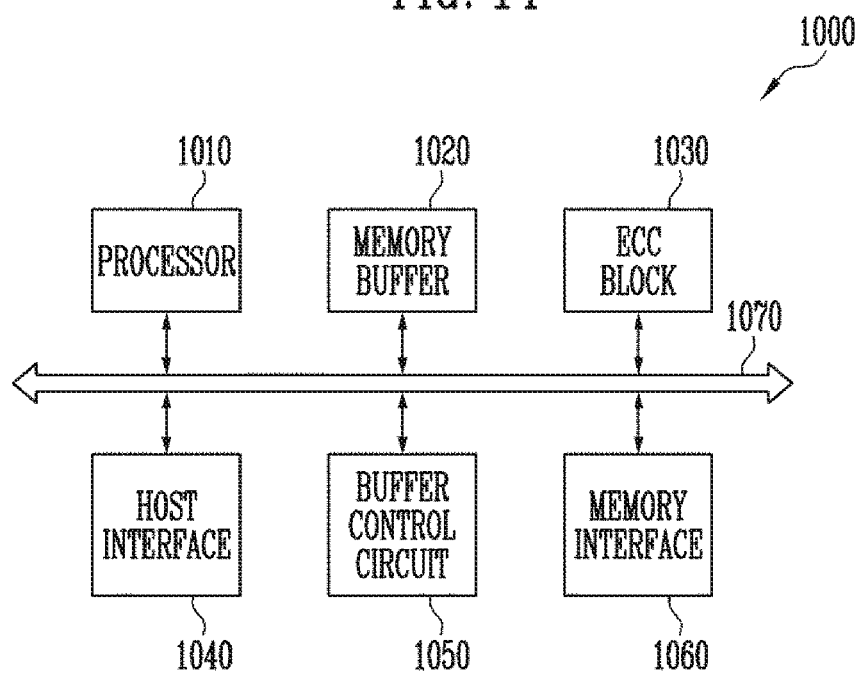
FIG. 14 is a diagram illustrating an embodiment of a memory controller of FIG. 1.

FIG. 14 is a diagram illustrating an embodiment of the memory controller 200 of FIG. 1.

According to FIG. 14, a memory controller 1000 is coupled to a host and a memory device. In response to a request received from the host, the memory controller 1000 may access the memory device. For example, the memory controller 1000 may control write, read, erase, and background operations of the memory device. The memory controller 1000 may provide an interface between the memory device and the host. The memory controller 1000 may run firmware for controlling the memory device.

Referring to FIG. 14, the memory controller 1000 may include a processor 1010, a memory buffer 1020, an error correction code (ECC) block 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processing unit 1010 may use a randomizing seed to randomize data received from the host. The randomized data may be provided, as data to be stored, to the memory device and may be programmed in the memory cell array.

The processor may derandomize data received from the memory device during a read operation. For example, the processor 1010 may derandomize the data received from the memory device using a derandomizing seed. The derandomized data may be outputted to the host.

In an embodiment, the processor 1010 may run software or firmware to perform randomizing and derandomizing operations.

In an embodiment, the processor 1010 may perform the operation of the bad block management unit, described above with reference to FIGS. 1 and 11. For example, the processor 1010 may run firmware for performing an operation of replacing a bad block with a reserved block. The processor 1010 may set a reserved block which will replace a bad block, in accordance with the embodiment described above with reference to FIGS. 9 to 13.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC block 1030 may perform error correction. The ECC block 1030 may perform ECC encoding based on data to be written to the memory device through the memory interface 1060. The ECC-encoded data may be transferred to the memory device through the memory interface 1060. The ECC block 1030 may perform ECC decoding based on data received from the memory device through the memory interface 1060. In an example, the ECC block 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC block 1030, and the memory interface 1060. The control bus may be coupled to the host interface 1040, the processor 1010, the buffer control circuit 1050, the memory buffer 1020, and the memory interface 1060.

Figure 15:
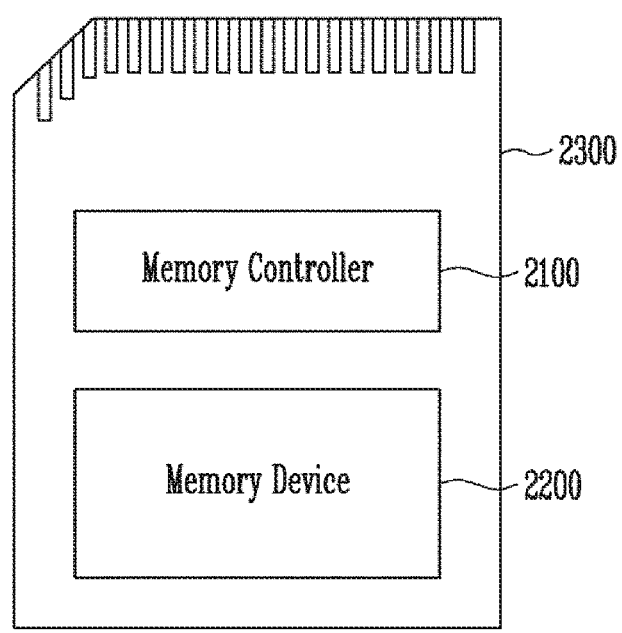
FIG. 15 is a block diagram illustrating an application example of a memory card system including the storage device according to an embodiment of the present disclosure.

FIG. 15 is a block diagram illustrating an application example of a memory card system including the storage device according to an embodiment of the present disclosure.

Referring to FIG. 15, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same way as the memory controller 200, described above with reference to FIG. 1.

In an embodiment, the memory controller 2100 may include components, such as a RAM, a processing unit, a host interface, a memory interface, and an ECC block.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), a Spin-Torque Magnetic RAM (STT-MRAM).

In an embodiment, the memory controller 2100 or the memory device 2200 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Small Outline (SOIC), Shrink Small Outline Package (SSOP), Thin Small Outline (TSOP), Thin Quad Flat-pack (TQFP), System In Package (SIP), Multi Chip Package (MCP), Wafer-level Fabricated Package (WFP), Wafer-Level Processed Stack Package (WSP), or the like, and may be provided as a single semiconductor package. Alternatively, the memory device 2200 may include a plurality of nonvolatile memory chips, which may be packaged based on the above-described package types and may be provided as a single semiconductor package.

In an embodiment, the memory controller 2100 and the memory device 2200 may be integrated into a single semiconductor device. In an embodiment, the memory controller 2100 and the memory device 2200 may be integrated into a single semiconductor device to configure a solid state drive (SSD). The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

In an embodiment, the memory device 2200 may be operated in the same way as the memory device 100, described above with reference to FIGS. 1 to 7. The memory controller 2100 may be operated in the same way as the memory controller, described above with reference to FIGS. 1 and 9 to 13.

Figure 16:
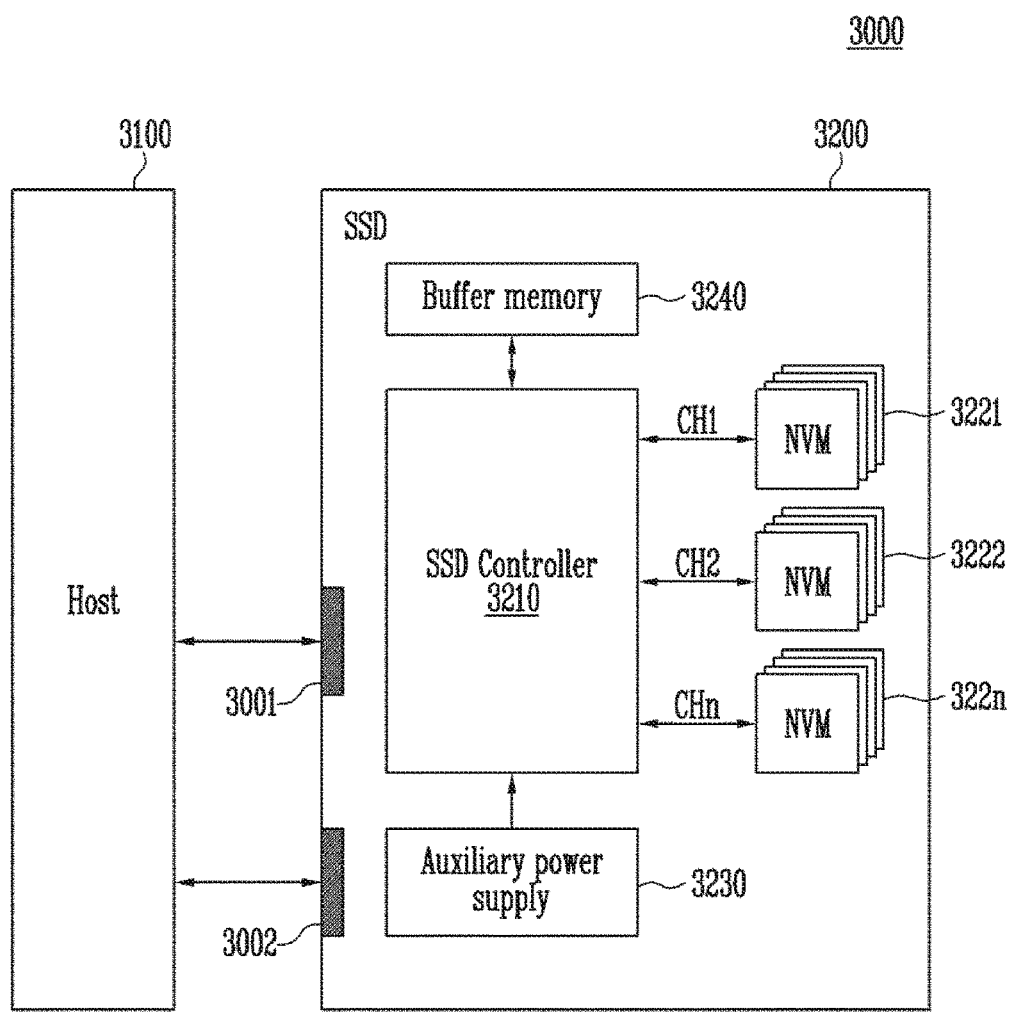
FIG. 16 is a block diagram illustrating an application example of a solid state drive (SSD) system including the storage device according to an embodiment of the present disclosure.

FIG. 16 is a block diagram illustrating an application example of a solid state drive (SSD) system including the storage device according to an embodiment of the present disclosure.

Referring FIG. 16, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

In an embodiment, the plurality of flash memories 3221 to 322n may be operated in the same way as the memory device 100, described above with reference to FIGS. 1 to 7. The SSD memory controller 3210 may be operated in the same way as the memory controller, described above with reference to FIGS. 1 and 9 to 13.

Figure 17:
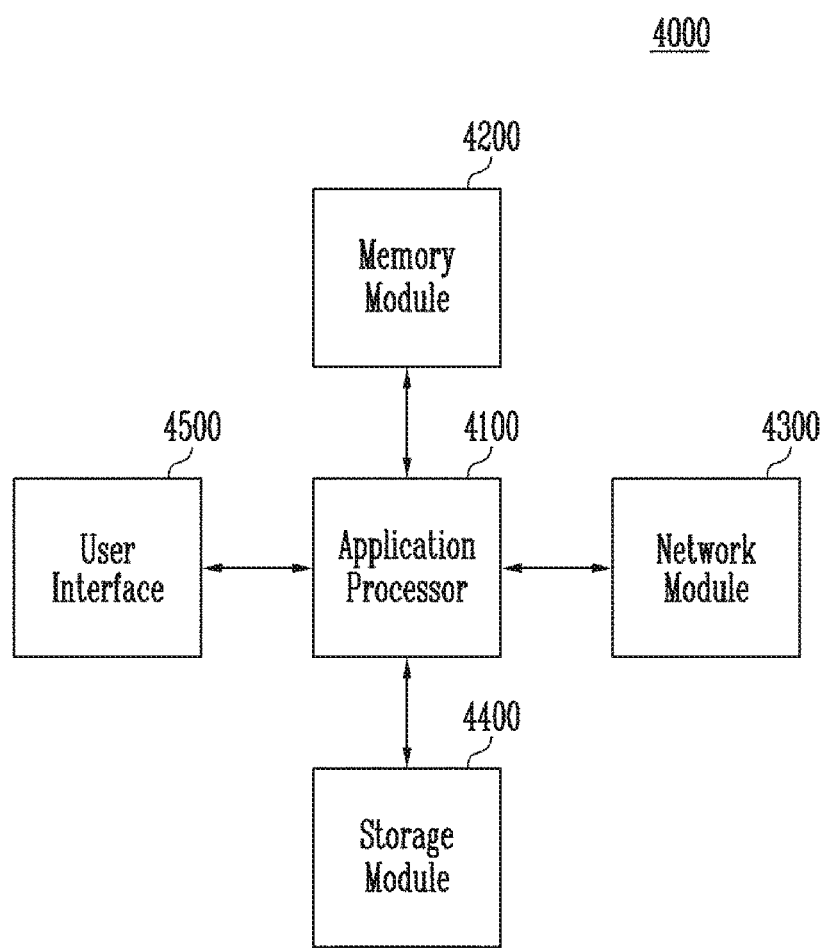
FIG. 17 is a block diagram illustrating an application example of a user system including the storage device according to an embodiment of the present disclosure.

FIG. 17 is a block diagram illustrating an application example of a user system including the storage device according to an embodiment of the present disclosure.

Referring to FIG. 17, a user system 4000 may include an application processor 4100, a memory module 4200, a network module 4300, a storage module 4400, and a user interface 4500.

The application processor 4100 may run components included in the user system 4000, an Operating System (OS)

or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device, described above with reference to FIGS. 1 to 5. The storage module 4400 may be operated in the same way as the storage device 50, described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a motor.

In accordance with the present disclosure, there are provided a storage device having improved operating speed and a method of operating the storage device.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-described embodiments, all steps may be selectively performed or may be omitted. In addition, the steps in each embodiment may not always be sequentially performed in regular order, and may be randomly performed in another order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A memory controller for controlling a plurality of dies, each including two or more planes, the memory controller comprising:
a reserved block information storage unit configured to store reserved block information that is information related to reserved blocks included in the plurality of dies; and
a bad block management control unit configured to, when a memory block included in a first die among the plurality of dies is determined as a bad block, replace the bad block with a reserved block included in a second die among the plurality of dies based on the reserved block information,
wherein the first die is different from the second die.

2. The memory controller according to claim 1, wherein the second die is a die having greatest difference in operation timing among all of dies with reference to the first die when the plurality of dies are operated in an interleaved manner.

3. The memory controller according to claim 1, wherein the reserved block information includes plane information about planes to which the reserved blocks included in the plurality of dies belong and status information indicating whether the reserved blocks included in the plurality of dies are available.

4. The memory controller according to claim 1, wherein the plurality of dies are coupled in common to a single channel.

5. A method of operating a memory controller for controlling a plurality of dies, each including two or more planes, the method comprising:
detecting a memory block included in a first die among the plurality of dies is determined as a bad block; and
allocating a reserved block in a second die to replace the bad block,
wherein the first die is different from the second die.

6. The method according to claim 5, wherein the allocating of the reserved block includes setting, as the second die, a die having an operation timing at which a largest difference is made by comparing an operation timing of each of the plurality of dies with an operation timing of the first die when the plurality of dies are operated in an interleaved manner.

7. The method according to claim 5, wherein the allocating of the reserved block includes setting the reserved block based on reserved block information that is information related to reserved blocks included in the plurality of dies.

8. The method according to claim 7, wherein the reserved block information includes plane information about planes to which the reserved blocks included in the plurality of dies belong and status information indicating whether the reserved blocks included in the plurality of dies are available.

9. The method according to claim 5, wherein the plurality of dies are coupled in common to a single channel.

10. A storage device comprising:
    a plurality of dies each including two or more planes; and
    a memory controller configured to control the plurality of dies,
    wherein the memory controller comprises:
    a bad block management unit configured to replace, when a memory block included in a first die among the plurality of dies is determined as a bad block, the bad block with a reserved block included in a second die among the plurality of dies, and
    wherein the first die is different from the second die.

* * * * *